(12) United States Patent
Miyake et al.

(10) Patent No.: US 11,849,566 B2
(45) Date of Patent: Dec. 19, 2023

(54) JOINT STRUCTURE, ELECTRONIC DEVICE AND METHOD FOR MANUFACTURING THE JOINT STRUCTURE

(71) Applicant: DENSO CORPORATION, Kariya (JP)

(72) Inventors: Toshihiro Miyake, Kariya (JP); Tadatomo Suga, Tokyo (JP); Eiji Higurashi, Tokyo (JP)

(73) Assignee: DENSO CORPORATION, Kariya (JP)

( * ) Notice: Subject to any disclaimer, the term of this patent is extended or adjusted under 35 U.S.C. 154(b) by 138 days.

(21) Appl. No.: 17/509,242

(22) Filed: Oct. 25, 2021

(65) Prior Publication Data
US 2022/0142005 A1 May 5, 2022

(30) Foreign Application Priority Data
Oct. 29, 2020 (JP) .................... 2020-181681

(51) Int. Cl.
*H05K 7/20* (2006.01)
*H05K 1/02* (2006.01)
(Continued)

(52) U.S. Cl.
CPC ..... *H05K 7/20472* (2013.01); *H01L 23/3735* (2013.01); *H05K 1/0204* (2013.01); *H05K 3/0061* (2013.01)

(58) Field of Classification Search
CPC ......... H01L 24/02; H01L 24/03; H01L 24/05; H01L 24/11; H01L 24/13; H01L 24/16; H01L 24/29; H01L 24/30; H01L 24/32; H01L 24/43; H01L 24/45; H01L 24/83; H01L 24/85; H01L 23/373; H01L 23/3735; H01L 23/3736; H01L 23/4006; H01L 23/49579; H01L 23/49822; H01L 23/49866; H01L 23/53204–53252;
(Continued)

(56) References Cited

U.S. PATENT DOCUMENTS 8,242,011 B2 * 8/2012 Lim ..................... H01L 24/11
438/612
8,779,604 B1 * 7/2014 Cheng ................ H01L 21/4825
257/781

(Continued)

FOREIGN PATENT DOCUMENTS

JP 2002-043779 A 2/2002
JP 2008-207221 A 9/2008
JP 2013-055218 A 3/2013

*Primary Examiner* — Amir A Jalali
(74) *Attorney, Agent, or Firm* — POSZ LAW GROUP, PLC

(57) ABSTRACT

A joint structure includes a first member, a second member and a metal joint layer. The first member has including a first surface and is made of material having one of copper, copper alloy, aluminum, or aluminum alloy. The second member includes a second surface that faces the first surface of the first material. The metal joint layer includes a gold joint layer made of material having gold or gold alloy and is disposed between the first surface of the first material and the second surface of the second material. A thickness of the metal joint layer is smaller than flatness of the first surface of the first material and flatness of the second surface of the second material. Fluorine is dispersed inside at least the gold joint layer included in the metal joint layer.

5 Claims, 8 Drawing Sheets

(51) Int. Cl.
*H05K 3/00* (2006.01)
*H01L 23/373* (2006.01)

(58) Field of Classification Search
CPC ........... H01L 21/52; H01L 2224/29144; H01L 2224/29124; H01L 2924/351; H05K 7/20; H05K 7/2039; H05K 7/20472; H05K 1/0204; H05K 1/0209; H05K 3/0061
See application file for complete search history.

(56) References Cited

U.S. PATENT DOCUMENTS

| | | | | |
|---|---|---|---|---|
| 2004/0166661 | A1* | 8/2004 | Lei | H01L 24/03 257/E23.021 |
| 2004/0222520 | A1* | 11/2004 | Jin | H01L 24/13 257/737 |
| 2007/0210450 | A1* | 9/2007 | Jang | H01L 24/13 257/734 |
| 2009/0126903 | A1* | 5/2009 | Kuibira | H05K 7/20963 165/67 |
| 2010/0158059 | A1 | 6/2010 | Yoshikawa | |
| 2011/0198733 | A1* | 8/2011 | Tomisaka | H01L 23/3171 257/622 |
| 2013/0029173 | A1* | 1/2013 | Weir | C09J 5/02 428/223 |
| 2014/0070409 | A1* | 3/2014 | Lai | H01L 24/13 257/737 |
| 2014/0273353 | A1* | 9/2014 | Yasunaga | H01L 24/27 438/125 |
| 2015/0108203 | A1* | 4/2015 | Elliot | B32B 9/041 228/121 |
| 2015/0171039 | A1* | 6/2015 | Cheng | H01L 24/02 257/737 |
| 2016/0152004 | A1* | 6/2016 | Niino | H05K 1/09 428/673 |
| 2016/0190417 | A1 | 6/2016 | Ichikawa et al. | |
| 2016/0240505 | A1* | 8/2016 | Tatsumi | B23K 35/30 |
| 2021/0013121 | A1* | 1/2021 | Miyake | H01L 24/32 |

* cited by examiner

FIG. 8

| EXPOSURE TIME TO ATMOSPHERE | PRE-JOINING TREATMENT | JOINING RESULT (N=3) | AMOUNT OF FLUORINE AT SURFACE AFTER PRE-JOINING TREATMENT | SAMPLE |
|---|---|---|---|---|
| 3 WEEKS | NO TREATMENT | WAS NOT JOINED (0/3) | — | — |
|  | ATMOSPHERIC-PRESSURE PLASMA TREATMENT | PARTIALLY JOINED (1/3) | — | — |
| 1 MONTH OR LONGER | NO TREATMENT | WAS NOT JOINED (0/3) | 1 | — |
|  | ATMOSPHERIC-PRESSURE PLASMA TREATMENT | WAS NOT JOINED (0/3) | 3 | — |
|  | ATMOSPHERIC-PRESSURE PLASMA TREATMENT + FLUORINE TREATMENT | JOINED (3/3) | 48 | A |
|  | ATMOSPHERIC-PRESSURE PLASMA TREATMENT + FLUORINE TREATMENT | JOINED (3/3) | 332 | B |

SAMPLE A:
ELEMENT MAPPING IMAGE
(FLUORINE)

SAMPLE B:
ELEMENT MAPPING IMAGE
(FLUORINE)

SAMPLE A:
ELEMENT MAPPING IMAGE
(GOLD)

SAMPLE B:
ELEMENT MAPPING IMAGE
(GOLD)

SAMPLE A:
CROSS SECTIONAL TEM IMAGE

SAMPLE B:
CROSS SECTIONAL TEM IMAGE

JOINT STRUCTURE, ELECTRONIC DEVICE AND METHOD FOR MANUFACTURING THE JOINT STRUCTURE

CROSS REFERENCE TO RELATED APPLICATION

This application is based on Japanese Patent Application No. 2020-181681 filed on Oct. 29, 2020, the disclosure of which is incorporated herein by reference.

TECHNICAL FIELD

The present disclosure relates to a joint structure, electronic devices and a method for manufacturing the joint structure.

BACKGROUND

In a joint structure, two members may be joined by a metal joint layer. For example, a semiconductor element may be disposed at a top surface of a circuit board. A lower surface of the circuit board and the top surface of a heat radiation member may be joined by a metal joint layer.

SUMMARY

The present disclosure describes a joint structure, electronic devices and a method for manufacturing the joint structure. The joint structure includes a first member, a second member and a metal joint layer. Each of the electronic devices includes the joint structure. The method for manufacturing the joint structure includes formation of the metal joint layer.

BRIEF DESCRIPTION OF THE DRAWINGS

The objects, features and advantages of the present disclosure will become more apparent from the following detailed description made with reference to the accompanying drawings. In the drawings:

FIG. 8 illustrates joining conditions and results;

DETAILED DESCRIPTION

Figure 1:
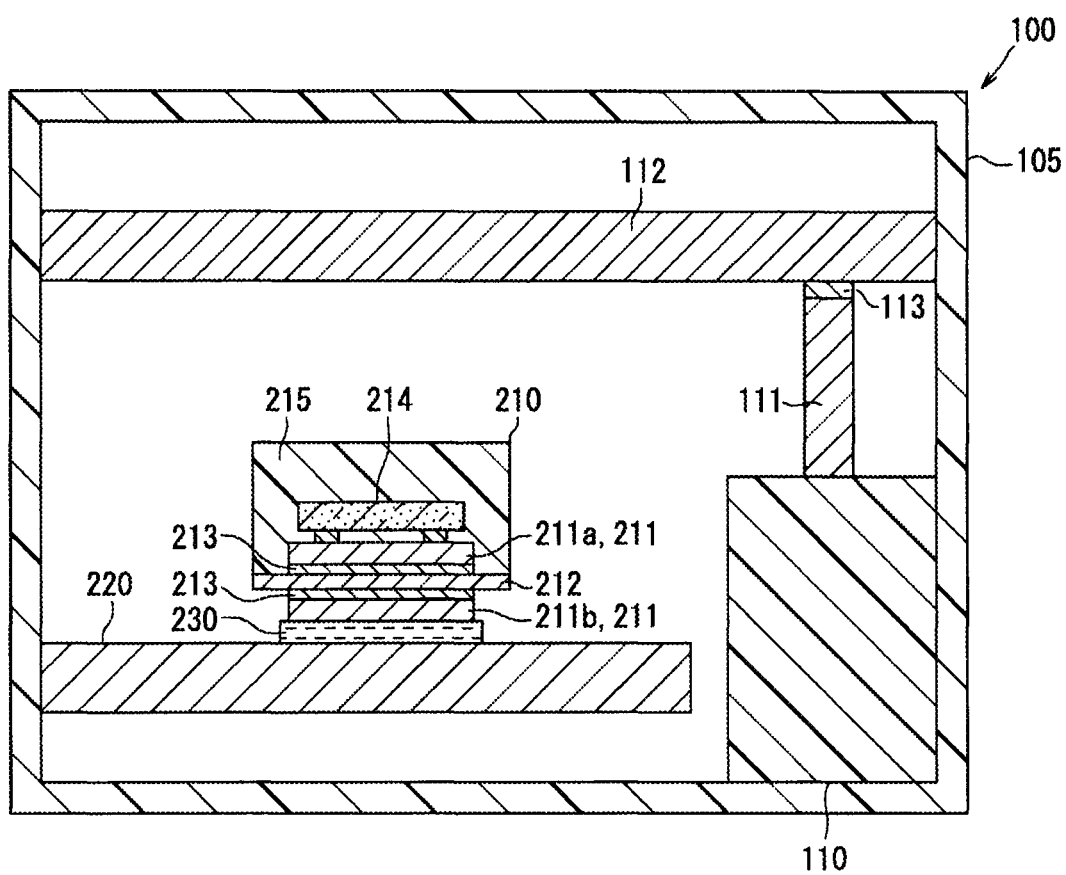
FIG. 1 is a cross-sectional view of an electronic device according to a first embodiment.

A semiconductor element may be disposed at a top surface of a circuit board. The lower surface of the circuit board and the top surface of a heat radiation member may be joined by a metal joint layer. The heat radiation member may also be referred to as a heat dissipation member. According to the above structure, stresses such as thermal stress and external vibration may be concentrated on the metal joint layer. The stress may be concentrated at the end portion or the outer peripheral portion of the metal joint layer. Thus, there is demand for further enhancement to such a joint structure described above.

According to a first aspect of the present disclosure, a joint structure includes a first member, a second member and a metal joint layer. The first member includes a first surface. The first member is made of material having at least one of copper, copper alloy, aluminum or aluminum alloy. The second member includes a second surface that faces the first surface of the first member. The metal joint layer includes at least a gold joint layer made of material having at least one of gold or gold alloy. The metal joint layer is disposed between the first surface of the first member and the second surface of the second member. The metal joint layer joins the first member and the second member. A joint region where the metal joint layer joins the first surface is defined as a first joint region, and another joint region where the metal joint layer joins the second surface is defined as a second joint region. A thickness of the metal joint layer is smaller than flatness of the first surface at the first joint region and flatness of the second surface at the second joint region. Fluorine is dispersed inside at least the gold joint layer included in the metal joint layer.

According to a second aspect of the present disclosure, an electronic device includes a heat radiation member and a joint structure. The joint structure includes a board, a heat conductor and a metal joint layer. The board has a first surface and a second surface. The heat radiation member is mounted on the second surface of the board. The board is made of made of material having at least one of copper, copper alloy, aluminum or aluminum alloy. The first surface is opposed to the second surface. The heat conductor is joined to the board and conduct heat generated by the heat radiation member through the board. The heat conductor has a surface facing the first surface of the board. The metal joint layer joins the board and the heat conductor. The metal joint layer has at least a gold joint layer made of material having at least one of gold or gold alloy, the metal joint layer disposed between the first surface of the board and the surface of the heat conductor. A joint region where the metal joint layer joins the first surface of the board is defined as a first joint region, and another joint region where the metal joint layer joins the surface of the heat conductor is defined as a second joint region. A thickness of the metal joint layer is smaller than flatness of the first surface of the board at the first joint region and flatness of the surface of the heat conductor at the second joint region. Fluorine is dispersed inside at least the gold joint layer included in the metal joint layer.

According to a third aspect of the present disclosure, an electronic device includes a joint structure having an electronic component, a wiring member and a metal joint layer. The electronic component includes a lead made of material having at least one of copper, copper alloy, aluminum or aluminum alloy, the lead has a first surface. The wiring member is jointed to the lead, the wiring member includes a second surface facing the first surface of the lead. The metal joint layer includes at least a gold joint layer made of material having at least one of gold or gold alloy. The metal joint layer is disposed between the first surface of the lead and the second surface of the wiring member, and join the lead and the wiring member. A joint region where the metal joint layer joins the first surface of the lead is defined as a first joint region, and another joint region where the metal joint layer joins the second surface of the wiring member is defined as a second joint region. A thickness of the metal joint layer is smaller than flatness of the first surface of the lead at the first joint region and flatness of the second surface of the wiring member at the second joint region. Fluorine is dispersed inside at least the gold joint layer included in the metal joint layer.

According to the joint structure in the first aspect and the respective electronic devices in the second and third aspects, the thickness of the metal joint layer is smaller than the flatness of the first surface of the first member, the first surface of the board or the first surface of the lead at the first joint region, and is smaller than the flatness of the second surface of the second member, the surface of the heat conductor or the surface of the wiring member at the second joint region. Therefore, the stress such as the thermal stress or the external vibration can be applied to the first member and the second member in the joint structure in the first aspect, the board and the heat conductor in the electronic device in the second aspect or the lead and the wiring member in the electronic device in the third aspect. In other words, it is possible to suppress the concentration of the stress at the metal joint layer.

The stress is concentrated at the end portion or the outer peripheral portion of the metal joint layer. Even if a minute crack occurs at the ends due to stress concentration, the moisture invasion can be suppressed by the fluorine element. It is possible to provide the joint structure with enhanced connection reliability.

According to a fourth aspect of the present disclosure, a method for manufacturing a joint structure includes: mirroring each of a first surface of a first member and a second surface of a second member to reach predetermined flatness at a joint region of each of the first surface and the second surface; forming a gold-containing film above at least one of the first surface or the second surface after the mirroring of the first surface and the second surface; removing a substance absorbed at a surface of the gold-containing film; forming a fluorine-containing film above the surface of the gold-containing film with removal of the substance; and forming a metal joint layer and then joining the metal joint layer to the first member and the second member through an ambient temperature joining. The first member is made of material having at least one of copper, copper alloy, aluminum or aluminum alloy. The metal joint layer includes at least a gold joint layer derived from the gold-containing film. The gold-containing film is formed at the joint region such that a thickness of the metal joint layer is smaller than the predetermined flatness. In the forming of the metal joint layer, fluorine is diffused and dispersed inside at least the gold-containing layer.

According to the method for manufacturing the joint structure described above, the thickness of the metal joint layer is smaller than the flatness of the first surface of the first member and the flatness of the second surface of the second member. Therefore, the stress such as the thermal stress or the external vibration can be applied to the first member and the second member. In other words, it is possible to suppress the concentration of the stress at the metal joint layer.

After the formation of the gold-containing film, the fluorine-containing film is formed at the surface of the gold-containing film with the removal of the adsorbates. In a process of forming the metal joint layer through the ambient temperature joining, the fluorine element is dispersed into at least the gold joint later of the metal joint layer. Therefore, even if a minute crack occurs at the end portion of the metal joint layer due to the concentration of stress, the moisture invasion can be suppressed by the fluorine element. Therefore, it is possible to provide the method for manufacturing the joint structure with enhanced connection reliability.

Hereinafter, multiple embodiments will be described with reference to the drawings. In some embodiments, parts that are functionally and/or structurally corresponding to each other and/or associated with each other are given the same reference numerals, or reference numerals with different hundred digit or more digits. For corresponding parts and/or associated parts, additional explanations can be made to the description of other embodiments. When only a part of the configuration is described in each embodiment, the configuration of the other embodiments described above can be applied to other parts of the configuration. Further, not only the combinations of the configurations explicitly shown in the description of the respective embodiments, but also the configurations of the plurality of embodiments can be partially combined even if they are not explicitly shown if there is no problem in the combinations in particular.

First Embodiment

The following describes the structure of an electronic device with reference to FIG. 1.

(Electronic Device)

As illustrated in FIG. 1, an electronic device 100 includes a housing 105, an electronic component 110, a bus bar 112, a semiconductor module 210, and a cooler 220. The housing 105 stores multiple components. The housing 105 in the present embodiment stores the electronic component 110 and the semiconductor module 210 as one or more of the multiple components. The housing 105 is made of, for example, a resin material and a metal material.

The electronic component 110 includes a lead 111 protruded from the main component. The lead 111 is an external connection terminal. The bus bar 112 is a plate-shaped wiring member. The lead 111 and the bus bar 112 may be made of a metal material such as copper having enhanced conductivity. The metal joint layer 113 is disposed between the lead 111 and the bus bar 112. The metal joint layer 113 joins the lead 111 and the bus bar 112. The metal joint layer 113 is electrically connected to the lead 11 and the bus bar 112. The metal joint layer 113 includes at least a gold joint layer. The lead 111 and the bus bar 112 are connected by an ambient temperature joining method at a normal temperature. The normal temperature may be referred to as a room temperature in the present disclosure.

The semiconductor module 210 includes a heat radiation unit, a semiconductor chip 214 and a sealing resin body 215. The heat radiation unit includes a heat sink 211 and an insulation plate 212. The heat radiation unit includes a pair of heat sinks 211, and the insulation plate 212 is disposed between the heat sinks 211. A pair of the heat sinks 211 includes a first heat sink 211a and a second heat sink 211b. The first heat sink 211a is disposed at a position closer to the semiconductor chip 214 than the insulation plate 212. The second heat sink 211b is disposed at a position farther from the semiconductor chip 214 than the insulation plate 212. The heat sinks 211 are made of a metal material with enhanced electrical conductivity and enhanced thermal conductivity such as copper.

The insulation plate 212 electrically separates the first heat sink 211a and the second heat sink 211b. The insulation plate 212 is made of a ceramic material having enhanced thermal conductivity such as silicon nitride, aluminum nitride, and silicon carbide. The metal joint layer 213 is disposed between each of the heat sinks 211 and the insulation plate 212. The insulation plate 212 is thermally connected to the heat sinks 211. One of the metal joint layers 213 joins the first heat sink 211a and the insulation plate 212. The other one of the metal joint layers 213 joins the second heat sink 211b and the insulation plate 212. Each of the metal joint layers 213 includes at least a gold joint layer. The heat sink 211 and the insulation plate 212 are connected by the ambient temperature joining method at the normal temperature.

The semiconductor chip 214 is provided by forming an element such as a switching element at the semiconductor substrate. The semiconductor chip 214 may only have one element, or may also have multiple elements. Additionally, the semiconductor chip 214 may have elements with a variety of types. The semiconductor chip 214 may have a predetermined function individually, or may be a circuit having other electronic components (not shown) and a predetermined function. The semiconductor chip 214 is a heat radiation component that radiates heat through electrical conduction.

The semiconductor chip 214 is mounted on the first heat sink 211a. The semiconductor chip 214 is mounted on a surface of the first heat sink 211a opposite to the joint surface that joins the insulation plate 212. The semiconductor chip 214 is fixed to the first heat sink 211a. The semiconductor chip 214 is thermally connected to the first heat sink 211a. The semiconductor chip 214 may also be electrically connected to the first heat sink 211a. In this situation, the first heat sink 211a functions as a wiring member for the semiconductor chip 214. The semiconductor chip 214 may not be electrically connected to the first heat sink 211a, but may be connected to other wiring members (not shown).

The sealing resin body 215 seals the semiconductor chip 214. In the present embodiment, the sealing resin body 215 seals the metal joint layer 213, the first heat sink 211a and the semiconductor chip 214 for each surface of the insulation plate 212. The sealing resin body 215 is a molded body made of, for example, an epoxy resin. The sealing resin body 215 can be formed by, for example, transfer molding or potting.

The cooler 220 may be referred to as a heat exchange unit. The cooler 220 has a flow path (not shown) through which a refrigerant flows. As the refrigerant, a phase-changing refrigerant such as water or ammonia or a non-phase-changing refrigerant such as ethylene glycol can be used.

The semiconductor module 210 is disposed above a surface of the cooler 220. A heat radiation member 230 with flexibility such as a heat radiation gel, heat grease, and a heat radiation sheet is disposed between the semiconductor module 210 and the cooler 220. The heat radiation member 230 is closely in contact with a surface of the second heat sink 211b opposite to the joint surface that joins the insulation plate 212. The semiconductor module 210 is thermally connected to the cooler 220 through the heat radiation member 230. The heat generated by the semiconductor chip 214 is conducted to the cooler 220 through the first heat sink 211a, the insulation plate 212 and the second heat sink 211b. The first heat sink 211a is a board on which the heat radiation components are mounted. The insulation plate 212 is a thermal conduction member that is joined to the circuit board, and conducts the heat generated by the heat radiation component through the circuit board.

(Joint Structure)

Figure 2:
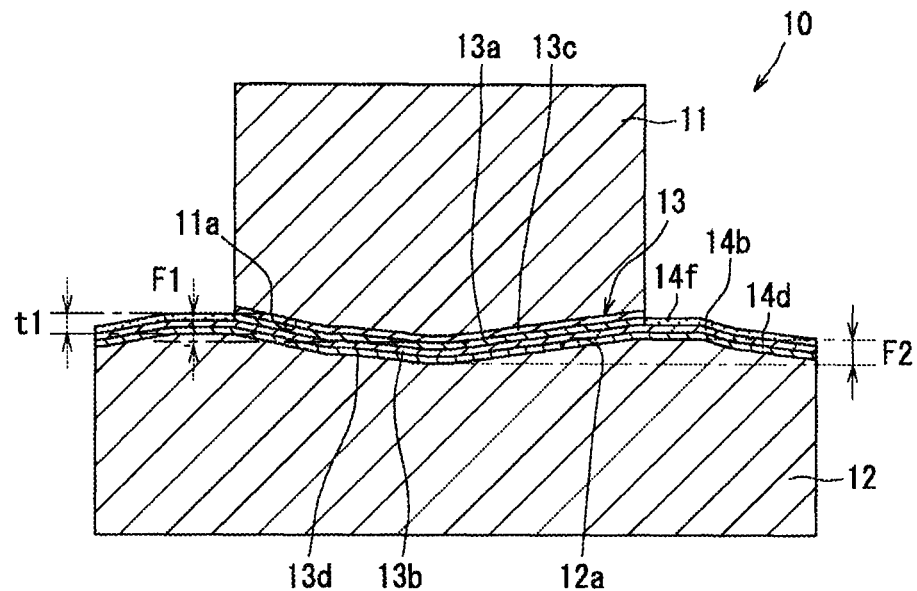
FIG. 2 is a cross-sectional view of a joint structure according to the first embodiment.

The following describes a joint structure based on FIG. 2.

As shown in FIG. 2, a joint structure 10 includes a first member 11, a second member 12 and a metal joint layer 13 that joins the first member 11 and the second member 12. In the electronic device 100, the lead 111 corresponds to the first member 11, the bus bar 112 corresponds to the second member 12, and the metal joint layer 113 corresponds to the metal joint layer 13. The heat sink 211 corresponds to the first member 11, the insulation plate 212 corresponds to the second member 12, and the metal joint layer 213 corresponds to the metal joint layer 13. The electronic device 100 includes a joint structure 10. FIG. 1 illustrates the metal joint layers 113, 213 in a simplified manner.

The first member 11 is a metal member made of any of copper, a copper alloy, aluminum, and an aluminum alloy as a material. The first member 11 includes a first surface 1a as a surface that faces the second member 12.

The second member 12 is a member included in the joint structure with the first member 11 and the metal joint layer 13. The second member 12 in the present embodiment is made of, for example, any of a pure metal such as copper and aluminum, an alloy such as a copper alloy and an aluminum alloy, and ceramics such as silicon nitride, aluminum nitride, and silicon carbide. In addition to the above materials for the second member 12, the materials for the second member 12 may also be, for example, a semiconductor such as silicon and resin. The second member 12 may be made of material different from the first member 11, or may be made of material identical to the first member 11. The second member 12 includes a second surface 12a as a surface that faces the first surface 11a of the first member 11. The first surface 11a and the second surface 12a are joint surfaces.

The arrangement of the first member 11 and the second member 12, in other words, the relation of magnitudes are not particularly restricted in a plan view as viewed in an opposing direction between the first member 11 and the second member 12, in other words, in a thickness direction of the metal joint layer 13. In the following, a plan view in the thickness direction may be simply referred to as a plan view. The first member 11 and the second member 12 may respectively at least have regions overlapping each other in the plan view. In the present embodiment, the second surface 12a of the second member 12 includes the entire region of the first surface 11a in the plan view. The entire region of the first surface 11a of the first member 11 faces the second surface 12a of the second member 12. A portion of the second surface 12a of the second member 12 faces the first surface 11a of the first member 11, and a remaining portion of the second surface 12a is a region that does not face the first member 11. The opposing direction may also be referred to as a facing direction.

The metal joint layer 13 is disposed between the first surface 11a of the first member 11 and the second surface 12a of the second member 12, and joins the first member 11 and the second member 12. The metal joint layer 13 is disposed at least a part of the facing region between the first member 11 and the second member 12. In the present embodiment, the metal joint layer 13 is disposed almost the entire region of the facing region between the first member 11 and the second member 12. The facing region may also be referred to an opposing region.

The metal joint layer 13 includes a first joint layer and a second joint layer. The second joint layer is disposed between the first member 11 and the first joint layer, and/or is disposed between the second member 12 and the first joint layer. The first joint layer is made of gold or a gold alloy as material for the first joint layer. The first joint layer may also be referred to as a gold joint layer or a gold-containing joint layer. The first joint layer joins the first member 11 and the second member 12 at the metal joint layer 13. The metal joint layer 13 in the present embodiment includes first joint layers 13a, 13b.

The first joint layer 13a is mainly a joint layer derived from a first metal film 14a formed above the first surface 11a of the first member 11. The first joint layer 13b is mainly a joint layer derived from a first metal film 14b formed above the second surface 12a of the second member 12. Each of the first metal films 14a, 14b is a gold-containing film formed as material made of gold or a gold alloy. The gold inside the first metal film 14a and the gold inside the first metal film 14b are mutually diffused to form the first joint layers 13a, 13b. The first joint layers 13a, 13b form a single gold-containing joint layer. As illustrated in FIG. 2, the joint structure 10 includes the first metal film 14b above non-facing region of the second surface 12a of the second member 12. The first metal film 14b surrounds the first joint layer 13b and, by extension, the metal joint layer 13 in the plan view. The first metal film 14b in the non-facing region is a portion of the first metal films 14a and 14b that does not contribute to joining and remains as a film. The non-facing region described in the present disclosure refers to a region where the first surface 11a does not face the second surface 12a.

The second joint layer is made of a material having a smaller thermal expansion coefficient than the material included in the first joint layer. The second joint layer is made of material having, for example, at least one of tantalum, tungsten, titanium and chromium. These metals respectively have smaller thermal expansion coefficients than the gold or gold alloys. The second joint layer is provided in the metal joint layer 13 for, for example, relieving stress. The metal joint layer 13 in the present embodiment includes second joint layers 13c, 13d.

The second joint layer 13c is disposed between the first member 11 and the gold joint layer (the first joint layer 13a). The second joint layer 13d is disposed between the second member 12 and the gold joint layer (the first joint layer 13b). Each of the second joint layers 13c, 13d may have a single-layered structure containing any of tantalum, tungsten, titanium and chromium, or may have a multi-layered structure. The second joint layer 13c is a joint layer derived from a second metal film 14c formed above the first surface 11a of the first member 11. The second joint layer 13d is a joint layer derived from a second metal film 14d formed above the second surface 12a of the second member 12. Each of the second metal films 14c, 14d is a metal film made of material having at least one of tantalum, tungsten, titanium and chromium. As illustrated in FIG. 2, the joint structure 10 includes the second metal film 14d above non-facing region of the second surface 12a of the second member 12. The second metal film 14d surrounds the first joint layer 13d and, by extension, the metal joint layer 13 in the plan view. The second metal film 14d in the non-facing region is a portion of the second metal films 14c and 14d that does not contribute to joining and remains as a film.

In the following, the first joint layers 13a, 13b and the second joint layers 13c, 13d are simply referred to as joint layers 13a, 13b, 13c, 13d. The first metal films 14a, 14b and the second metal films 14c, 14d are simply referred to as metal films 14a, 14b, 14c, 14d. Each of the metal films 14a, 14b, 14c, 14d is formed by a sputtering method. The thickness of each of the joint layers 13a, 13b, 13c, 13d is in nanometer (nm) scale, for example, more than 10 nm and less than 20 nm. The thickness t1 of the metal joint layer 13 is smaller than the flatness F1 of the first surface 11a of the first member 11 and the flatness F2 of the second surface 12a of the second member 12 in the joint region. The thickness t1 is in nanometer scale, for example, more than 10 nm and less than 20 nm. Each of the flatness F1 and the flatness F2 is in micrometer (μm) scale, for example, 1 to 3 μm. The joint region is a region where the metal joint layer 13 is formed at the facing region.

The metal joint layer 13 contains a fluorine element in at least the first joint layers 13a, 13b. The fluorine element is dispersed inside the first joint layers 13a, 13b, in other words, the gold-containing joint layer.

The joint structure 10 in the present embodiment further includes a fluorine-containing film 14f. The fluorine-containing film 14f may be a film containing a fluorine element (fluorine atom). The fluorine element dispersed inside the first joint layers 13a, 13b is derived from the fluorine-containing film 14f formed above the first metal films 14a, 14b. The fluorine-containing film 14f in the non-facing region included in the joint structure does not diffuse to the metal joint layer 13, and is a portion remaining as a film. The fluorine-containing film 14f surrounds the first joint layer 13d and, by extension, the metal joint layer 13 in the plan view.

(Method for Manufacturing Joint Structure)

Figure 3:
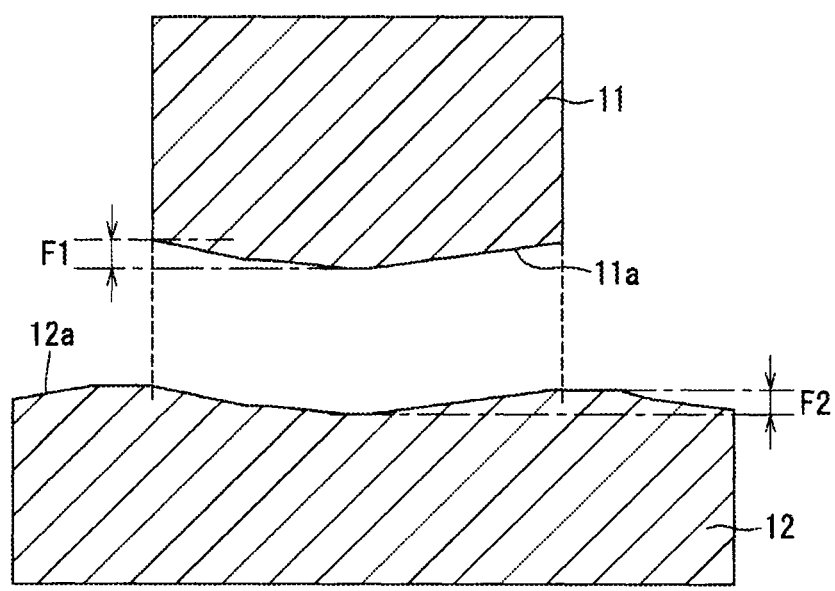
FIG. 3 is a cross-sectional view of a method for manufacturing the joint structure.
Figure 4:
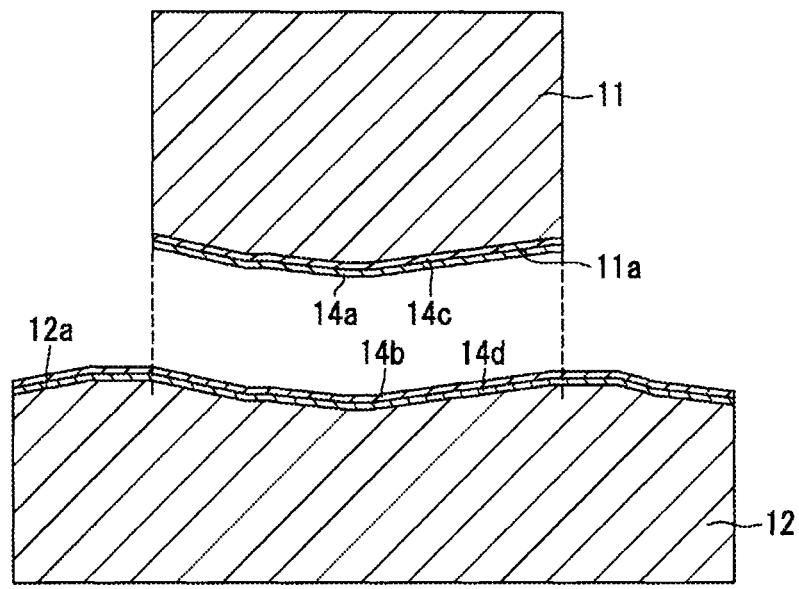
FIG. 4 is a cross-sectional view of a method for manufacturing the joint structure.
Figure 5:
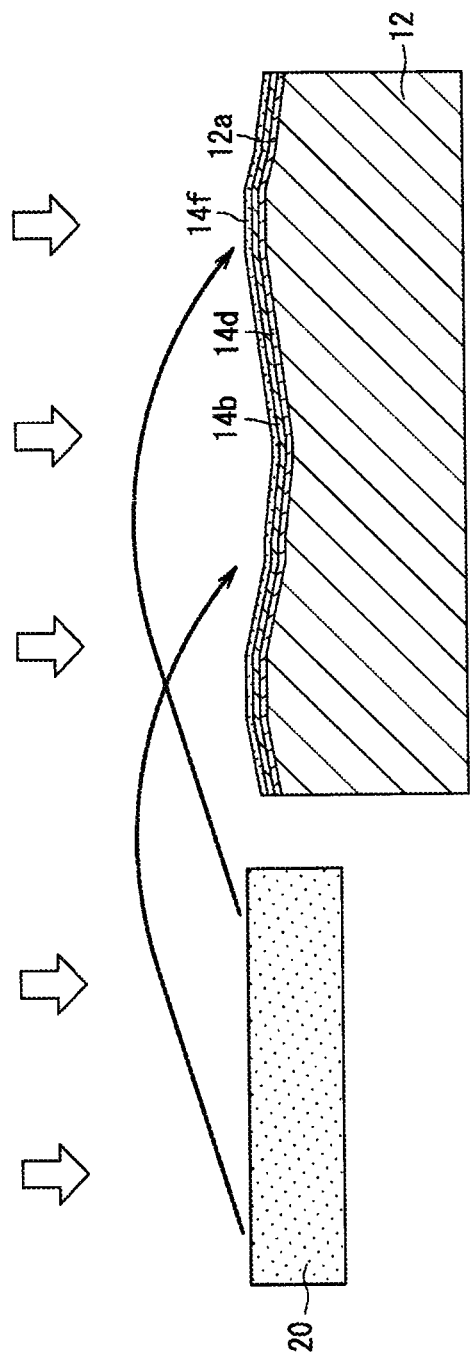
FIG. 5 is a cross-sectional view of a method for manufacturing the joint structure.
Figure 6:
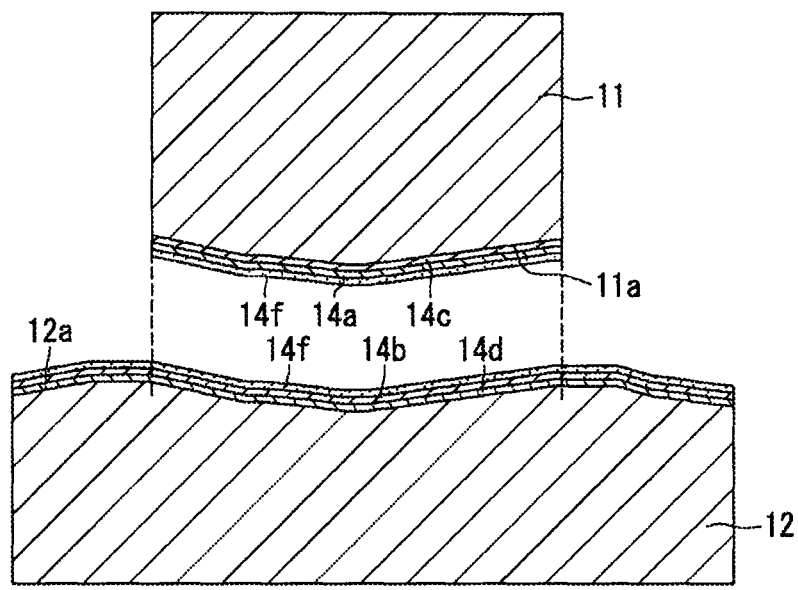
FIG. 6 is a cross-sectional view of a method for manufacturing the joint structure.

The following describes an example of a method for manufacturing the joint structure with reference to FIGS. 2 to 6. FIGS. 3 to 6 are respectively cross sectional views corresponding to FIG. 2. In FIG. 5, an atmospheric-pressure plasma treatment is shown in a simplified manner. In the present disclosure, only the treatment performed at the second member 12 is illustrated in the drawings. FIGS. 3, 4 and 6 illustrate that the first member 11 and the second member face each other for easily understanding the relationship with FIG. 2. The respective treatments may be performed in a state where the first member 11 does not face the second member 12. Before joining, the treatment may be individually performed on the first member 11 and the second member 12, but the first member 11 and the second member 12 may be processed together by the mutual treatment.

First, a mirroring treatment is performed. As illustrated in FIG. 3, the mirroring treatment is performed at the first surface 11a of the first member 11 and the second surface 12 of the second member 12 to achieve a predetermined flatness at the joint region. The predetermined flatness is in micrometer (μm) scale, for example, 1 to 3 μm. In particular, the first surface 11a and the second surface 12a are mirrored by a treatment such as Chemical Mechanical Polishing (CMP), for example, polishing, grinding, or wrapping.

Subsequently, a process for forming the metal film for the formation of the metal joint layer 13 is performed. In the present embodiment, since the first member 11 and the second member 12 are joined at a normal temperature under atmospheric pressure, the metal film is formed on both of the first surface 11a and the second surface 12a. In particular, as illustrated in FIG. 4, the second metal film 14c is formed above the first surface 11a of the first member 11 by, for example, the sputtering method. Next, the first metal film 14a, in other words, the gold-containing film is formed above the second metal film 14c by, for example, the sputtering method. In the present embodiment, the second metal film 14c and the first metal film 14a are formed at the entire surface of the first member 11a.

Similarly, the second metal film 14d is formed above the second surface 12a of the second member 12 by, for example, the sputtering method. Next, the first metal film 14b, in other words, the gold-containing film is formed above the second metal film 14d by, for example, the sputtering method. In the present embodiment, the second metal film 14d and the first metal film 14b are formed over the entire surface of the second surface 12a.

The metal film with a multi-layered structure is formed above the first surface 11a and the second surface 12a. The first metal films 14a, 14b may be referred to as an upper base layer, and the second metal films 14c, 14d may be referred to as a lower base layer. In the joint region, each of the metal films 14a, 14b, 14c, 14d is formed so that the thickness t1 of the metal joint layer 13 is smaller than the flatness F1 and the flatness F2. In the present embodiment, the metal films 14a, 14b, 14c, 14d are formed so that the respective thicknesses in the joint region are in nanometer (nm) scale, for example, more than 10 nm and less than 20 nm.

Next, during the process from the formation of the metal film to the joining treatment, a removal treatment for removing adsorbates on the surface of the first metal film (gold-containing film) as the upper base film and a formation process for forming the fluorine-containing film at the surface of the first metal film with the removal of the adsorbates are performed. Adsorbates may be also referred to as absorbed substances.

In the present embodiment, the removal treatment for removing the adsorbates and the film formation process for forming the fluorine-containing film are performed in the mutual process. As illustrated in FIG. 5, the atmospheric-pressure plasma treatment is performed for the second member 12 formed with the first metal film 14b and the second metal film 14d, and for the fluorine-containing member 20. An inert gas such as argon (Ar) can be used as the carrier gas. The fluorine-containing member 20 may be a member having the fluorine element. For example, a sheet member of polytetrafluoroethylene can be used.

Through the plasma treatment, the adsorbates at the surface of the first metal film 14b, for example, moisture and oxygen contained in the air are removed. The fluorine element is repelled from the fluorine-containing member 20. The repelled fluorine element is deposited on the surface of the first metal film 14b with the removal of the adsorbates, and forms the fluorine-containing film 14f. The fluorine-containing film 14f is a film containing at least the fluorine element. The thickness of the fluorine-containing film 14f is in nanometer scale, and is smaller than or equal to the respective thicknesses of the metal films 14a, 14b, 14c, 14d. Through the plasma treatment, the adsorbates at the surface of the first metal film 14b is removed, and the fluorine-containing film 14f is formed above the first metal film 14b. After the removal of the adsorbates, the fluorine-containing film 14f is formed before the occurrence of re-absorption.

Although not shown, similarly, the atmospheric-pressure plasma treatment is performed for the first member 11 formed with the first metal film 14a and the second metal film 14c, and for the fluorine-containing member 20. Through the plasma treatment, the adsorbates at the surface of the first metal film 14a is removed. The fluorine element repelled from the fluorine-containing member 20 is deposited on the surface of the first metal film 14a with the removal of the adsorbates, and forms the fluorine-containing film 14f. Through the plasma treatment, the adsorbates at the surface of the first metal film 14a is removed, and the fluorine-containing film 14f is formed above the first metal film 14a. After the removal of the adsorbates, the fluorine-containing film 14f is formed before re-absorption occurs.

As illustrated in FIG. 6, the fluorine-containing film 14f is formed at each of the respective surfaces of the first metal films 14a, 14b. In other words, the respective surfaces of the first metal films 14a, 14b are coated by fluorine.

The present embodiment describes an example of the plasma treatment under atmospheric pressure. However, it is not restricted to this example. The plasma treatment may performed under vacuum or under reduced pressure. An ion beam treatment may be performed instead of the plasma treatment.

Subsequently, a process for forming the metal joint layer 13 is performed. In other words, a process for joining the first member 11 and the second member 12 is performed at the normal temperature. In the present embodiment, the metal joint layer 13 is formed in the atmosphere. As illustrated in FIG. 6, the position of the first member 11 and the position of the second member 12 are determined so that the joint region of the first surface 11a of the first member 11 and the joint region of the second surface 12a of the second member 12 face to each other. Although not shown, the first member 11 and the second member 12 are relatively displaced in a direction in which the first surface 11a and the second surface 12a are closer to each other, and the fluorine-containing films 14 are in contact. In this state, if the pressure is applied in an alignment direction of the first member 11 and the second member 12, the fluorine element in the fluorine-containing film 14f diffuses inside at least the first metal films 14a, 14b. The first metal films 14a, 14b are in contact and the gold mutually diffuses to form the metal joint layer (the first joint layer 13a, 13b). A portion of the second metal films 14c, 14d disposed between the members 11, 12 and the gold joint layer forms the second joint layers 13c, 13d. The metal joint layer 13 containing the first joint layers 13a, 13b and the second joint layers 13c, 13d is formed.

When the metal joint layer 13 is formed through the ambient temperature joining, the fluorine element diffuses and disperses inside at least the first joint layers 13a, 13b. Therefore, the fluorine element disperses inside at least the first joint layers 13a, 13b of the formed metal joint layer 13. The portion of the metal films 14a, 14b, 14c, 14d that does not contribute to the formation of the metal joint layer 13 remains as the metal film. In the present embodiment, in the first metal film 14b and the second metal film 14d formed above the second surface 12a of the second member 12, most of the non-facing region not facing the first surface 11a of the first member 11 remains as the first metal film 14b and the second metal film 14d. The fluorine-containing film 14f disappears in the joint region, and remains in the non-facing region.

Summary of First Embodiment

Stress such as thermal stress or external vibration acts on the joint structure having two members. For example, when the respective thermal expansion coefficients of the two members in the joint structure are different, thermal stress (the first thermal stress) occurs due to expansion and contraction inside the joint structure. In a case of an electronic device having the joint structure, thermal stress (the second thermal stress) occurs due to the expansion and contraction in the entire electronic device caused by being assembled using multiple different materials. The second thermal stress also acts on the joint structure with similar types of materials. Not only the thermal stress but also stress such as vibration transmitted from an external mechanism mechanically connected to the joint structure and an external device acts on the joint structure. In a situation of connecting the two member with the use of a joint member such as solder, the stress is concentrated at the joint member since the joint material is thicker.

In the joint structure 10 according to the present embodiment, the thickness t1 of the metal joint layer 13 is smaller than the flatness F1 of the first surface 11a of the first member 11 at the joint region and the flatness F2 of the second surface 12a of the second member 12 at the joint region. Since the metal joint layer 13 is thin, it is possible that the first member 11 and the second member 12 near the metal joint layer 13 receive the stress. In other words, it is possible to suppress the concentration of the stress at the metal joint layer 13. Therefore, it is possible to have a higher joining strength and a higher durability fatigue strength.

Figure 7:
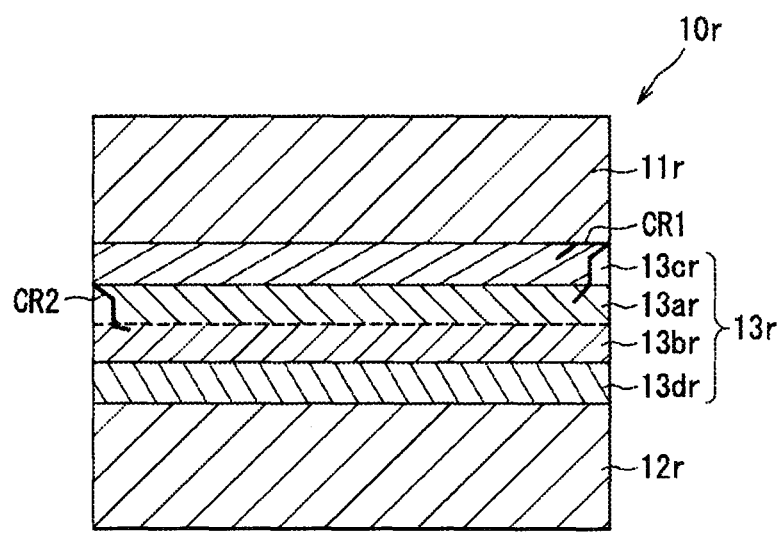
FIG. 7 is a cross-sectional view of a method for manufacturing a joint structure in a reference example.

FIG. 7 illustrates a joint structure 10r as a reference example. In the reference example, the elements identical or related to the present embodiment are denoted by adding "r" to the tails of the reference numerals in the present embodiment. The stress is concentrated at the end portion of the metal joint layer 13r joining the first member 11r and the second member 12r. The end portion is an outer peripheral end of the metal joint layer 13r in the plan view. When the tissue is enlarged due to stress concentration, minute cracks CR1 and CR2 are generated. The illustrated crack CR1 starts from the interface between the first member 11r and the second joint layer 13cr, as an end portion of the metal joint layer 13r. The illustrated crack CR2 starts from the interface between the first joint layer 13ar and the second joint layer 13cr, as an end portion of the metal joint layer 13r.

When moisture in the air intrudes, the cracks CR1, CR2 develop through, for example, corrosion. For example, the crack CR1 develops along the interface between the first member 11r and the second joint layer 13cr. The crack CR1 extends to, for example, the first joint layer 13ar. The crack CR2 extends to, for example, the first joint layer 13br. Therefore, the durability against fatigue is reduced.

In the present embodiment, it is possible to prevent moisture intrusion by moisture repellent effect of the fluorine element dispersed inside at least the first joint layers 13a, 13b of the metal joint layer 13. Even if minute cracks are generated at the ends of the metal joint layer 13 due to stress concentration, the intrusion of moisture can be suppressed. Therefore, it is possible to have a higher durability fatigue strength. It is possible to provide the joint structure 10 with enhanced connection reliability.

In the present embodiment, the metal joint layer 13 includes the second joint layer 13c and the second joint layer 13d. The second joint layer 13c is disposed between the first joint layer 13a and the first member 11, and the second joint layer 13d is disposed between the first joint layer 13b and the second member 12. The thickness t1 of the metal joint layer 13 having such multi-layered structure is smaller than the flatness F1 of the first surface 11a and the flatness F2 of the second surface 12a. Therefore, it is possible that the first member 11 and the second member 12 near the metal joint layer 13 receive the stress. Since the respective thermal expansion coefficients of the second joint layers 13c, 13d are smaller, it is possible to reduce the concentration of the thermal stress to the end portion of the metal joint layer 13. Therefore, it is possible to enhance the joining strength and the durability fatigue strength.

In the present embodiment, the second joint layers 13c, 13d are made of material having, for example, at least one of tantalum, tungsten, titanium and chromium. These materials enhance the adhesion between the first member 11 and the second member 12, reduce the concentration of the thermal stress on the first joint layers 13a, 13b, and contribute the enhancement of the initial strength and the durability fatigue strength.

For example, when tantalum is used as the material for the second joint layers 13c, 13d, the fluorine element diffuses to the second joint layers 13c, 13d. It is possible to effectively prevent from the moisture invasion by the moisture repellent effect of the fluorine element dispersed inside the second joint layers 13c, 13d.

In the present embodiment, after the formation of the first metal films 14a, 14b being the gold-containing films, until the formation of the metal joint layer 13, the adsorbates at the surfaces of the first metal films 14a, 14b are removed, and the fluorine-containing film 14f is formed at the surfaces of the first metal films 14a, 14b with the removal of the adsorbates. It is possible to inhibit the generation of the joining fault by removing the adsorbates. Since the fluorine-containing film 14f prevents from the idle adsorbates being re-absorbed to the surfaces of the first metal films 14a, 14b, it is possible to stabilize the joint under the atmosphere.

In the process of forming the metal joint layer 13 through the ambient temperature joining, the fluorine element derived from the fluorine-containing film 14f diffuses into at least the first joint layers 13a, 13b (gold joint layer) of the metal joint layer 13. Even if minute cracks are generated at the ends of the metal joint layer 13 due to stress concentration, the moisture intrusion can be suppressed by the fluorine element. It is possible to provide the joint structure 10 with enhanced connection reliability. Since the joining is performed at the normal temperature, the residual stress at the time of joining can be minimized.

In the present embodiment, the adsorbates at the surfaces of the first metal films 14a and 14b is removed by atmospheric pressure plasma treatment. Therefore, the manufacturing process can be simplified as compared with vacuum or reduced pressure.

In the present embodiment, the atmospheric-pressure plasma treatment is performed for the second member 12 formed with the first metal film 14b and the second metal film 14d, and for the fluorine-containing member 20. The removal of the adsorbates at the surfaces of the first metal films 14a, 14b and the formation of the fluorine-containing film 14f on the first metal films 14a, 14b may be performed by the mutual process. It is possible to simplify the manufacturing process. After the removal of the adsorbates, the fluorine-containing film 14f can be formed immediately. As a result, it is possible to inhibit the re-adsorption after removal of the adsorbates.

(Result of Trial Product)

FIG. 8 illustrates joining conditions and results at the time of producing a trial product. As shown in FIG. 8, the N number was set to 3 under all conditions. The exposure time to the atmosphere shown in FIG. 8 refers to the time of exposing the first metal film (gold-containing film) to the atmosphere after the formation of the first metal film (gold-containing film). The pre-joining treatment refers to a treatment performed before joining after the elapse of the exposure time in the atmosphere. The atmospheric-pressure plasma treatment refers to a plasma treatment at atmospheric pressure using argon (Ar) as a carrier gas. The fluorine treatment refers to a treatment for forming the fluorine-containing film. The adsorbates are removed through the plasma treatment and the fluorine-containing film is formed at the sample. The description of only the atmospheric pressure plasma treatment refers to a treatment without the fluorine treatment. The amount of the surface fluorine after the pre-joining treatment refers to the count ratio of Time-of-Flight Secondary Ion Mass Spectrometry (TOF-SIMS).

As shown in FIG. 8, when the pre-joining treatment was not performed, that is, when the treatment was not performed, the first member and the second member could not be joined in any of the situations of 3 weeks of the exposure to the atmosphere and 1 month or longer of the exposure to the atmosphere. When atmospheric pressure plasma treatment without fluorine treatment was performed as pre-joining treatment, joining was partially confirmed after 3 weeks of the exposure to the atmosphere, but the first member and the second member could not be joined after 1 month or longer of the exposure to the atmosphere. In other words, the first member and the second member could not be stably joined in any of the situations of 3 weeks of the exposure to the atmosphere and 1 month or longer of the exposure to the atmosphere. On the other hand, when the atmospheric-pressure plasma treatment and the fluorine treatment are performed, the first member and second member could be joined. The amount of fluorine is different between sample A and sample B. Sample B has a larger amount of fluorine than Sample A.

FIGS. 9A to 9F respectively illustrate TEM images and element mapping images for samples A and B described in FIG. 8. FIGS. 9B, 9C, 9E, 9F respectively illustrate gold (Au) and fluorine (F) shown as element mapping images. TEM is an abbreviation for Transmission Electron Microscope. EDX is an abbreviation for Energy Dispersive X-ray Spectroscopy, and may also be referred to as EDS.

Figure 9C:
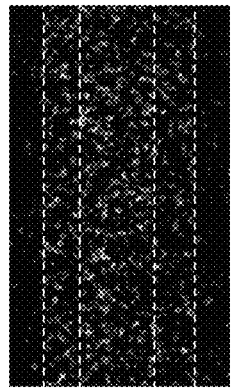
FIGS. 9A to 9F illustrate respective TEM images and element mapping images for samples A and B.
Figure 9F:
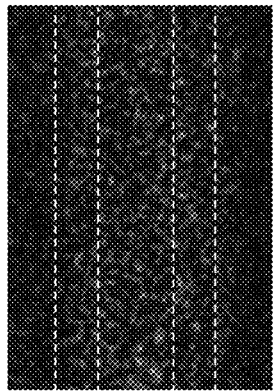
Figure 9B:
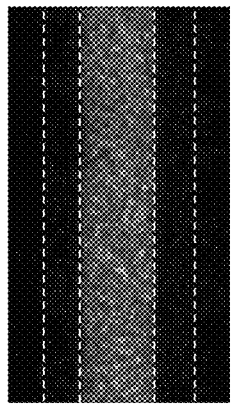
Figure 9E:
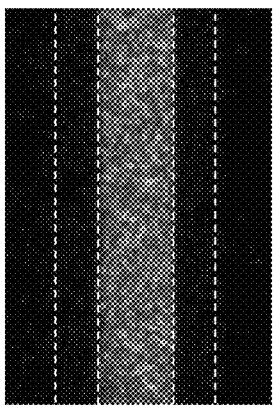
Figure 9A:
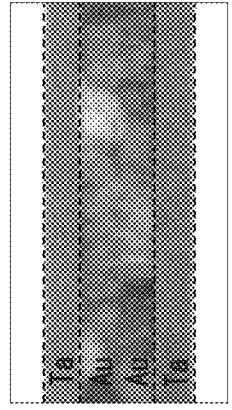
Figure 9D:
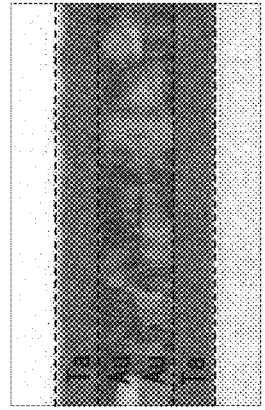

As shown in the respective TEM images in FIGS. 9A, 9D, in both samples A and B, gold crystal grains are formed over the two first joint layers. It is clear that the gold diffuses into each other and forms an enhanced joint state. As shown in the element mapping images, the fluorine element is dispersed inside the first joint layer in any one of the samples A, B. The fluorine element is dispersed inside the second joint layer made of tantalum (Ta). Based the results shown FIGS. 8, 9A to 9F, it was clarified that the first member and the second member can be satisfactorily joined by performing the plasma treatment and the fluorine treatment. It was also clarified that the fluorine element was dispersed inside the metal joint layer. As a result, it is possible to enhance the effect of suppressing the moisture invasion and the effect of the connection reliability.

Second Embodiment

The second embodiment is a modification of the preceding embodiment as a basic configuration and may incorporate description of the preceding embodiments. In the preceding embodiment, the removal or cleaning of adsorbates at the surfaces of the first metal films 14a, 14b and the formation of the fluorine-containing film 14f are performed by the mutual process. However, the removal of the adsorbates and the formation of the fluorine-containing film 14f can be individually performed.

Figure 10:
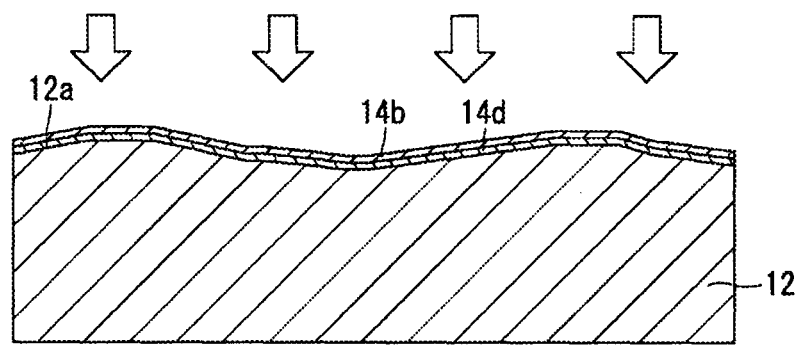
FIG. 10 is a cross-sectional view of a joint structure according to the second embodiment.

The process until the formation of the first metal films 14a, 14b is identical to the process described in the preceding embodiment. In the present embodiment, after the formation of the first metal films 14a, 14b, the process of removing the adsorbates is performed as shown in FIG. 10. The removal process is a process without the formation of the fluorine-containing film 14f. Similar to the preceding embodiment, the adsorbates at the surfaces of the first metal films 14a, 14b is removed through the plasma treatment under the atmospheric pressure or vacuum or ion beam treatment.

After the end of the process of removing the adsorbates, a process of forming the fluorine-containing film 14f above the first metal films 14a, 14b is performed. Although not shown, for example, the fluorine-containing film 14f may be formed by fluorine plasma treatment. The fluorine-containing film 14f may be formed by exposing the chamber to a fluoride gas such as $CHF_3$ or $CF_6$. The fluorine-containing film 14f may be formed by performing the plasma treatment on the fluorine-containing member 20.

After the formation of the fluorine-containing film 14f, the joining process identical to the preceding embodiment is performed. Thereby, the joint structure 10 can be obtained. Other structures are similar to those in the preceding embodiment.

Summary of Second Embodiment

The fluorine-containing film 14f may also be formed through a treatment different from the treatment for removing the adsorbates at the surfaces of the first metal films 14a, 14b. It is possible to inhibit the re-absorption by removing the adsorbates and then immediately forming the fluorine-containing film 14f.

Third Embodiment

The present embodiment is a modification of the preceding embodiment as a basic configuration and may incorporate description of the preceding embodiments. The metal joint layer 13 in the preceding embodiment includes the second joint layers 13c, 13d. However, the metal joint layer 13 may only include the first joint layers 13a, 13b.

Figure 11:
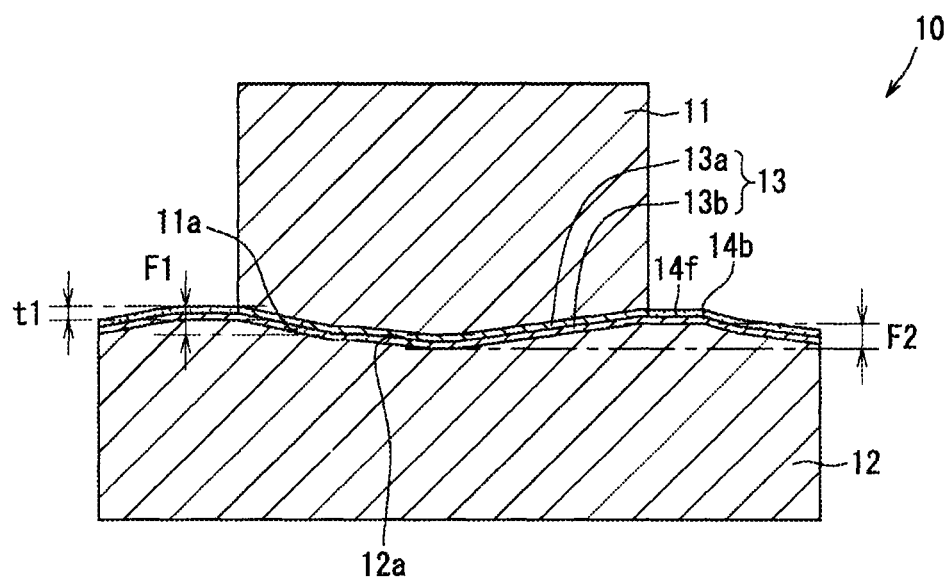
FIG. 11 is a cross-sectional view of a joint structure according to a third embodiment.

In the joint structure 10 shown in FIG. 11, the metal joint layer 13 only includes the first joint layers 13a, 13b. The first metal film 14b and the fluorine-containing film 14f are disposed above the second surface 12a of the second member 12 at the non-facing region. Other structures are similar to those in the preceding embodiment. The thickness t1 of the metal joint layer 13 is smaller than the flatness F1 of the first surface 11a in the joint region and the flatness F2 of the second surface 12a in the joint region. The fluorine element is dispersed over the first joint layers 13a, 13b, in other words, the entire metal joint layer 13. Such a joint structure 10 may form the first metal films 14a, 14b without forming the second metal films 14c, 14d in the process of forming the metal film.

Summary of Third Embodiment

In a structure in which the metal joint layer 13 only includes the gold joint layer (the first joint layers 13a, 13b), the thickness t1 of the metal joint layer 13 is smaller than the flatness F1 of the first surface 1 and the flatness F2 of the second surface 12a. Therefore, it is possible that the first member 11 and the second member 12 near the metal joint layer 13 receive the stress. It is possible to prevent the moisture intrusion by the moisture repellent effect of the fluorine element dispersed inside the entire metal joint layer 13. It is possible to provide the joint structure 10 with enhanced connection reliability.

Other Embodiments

The disclosure in this specification and drawings is not limited to the exemplified embodiments. The disclosure encompasses the illustrated embodiments and variations thereof by those skilled in the art. For example, the disclosure is not limited to the parts and/or combinations of elements shown in the embodiments. The disclosure may be implemented in various combinations. The disclosure may have additional parts that may be added to the embodiment. The disclosure encompasses omission of components and/or elements of the embodiments. The disclosure encompasses the replacement or combination of components and/or elements between one embodiment and another. The disclosed technical scope is not limited to the description of the embodiment. The several technical ranges disclosed are indicated by the description of the claims, and should be construed to include all modifications within the meaning and range equivalent to the description of the claims.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

Spatial relative terms "below", "above", etc. are used herein to facilitate the description that describes relationships between one element or feature and another element or feature. Spatial relative terms can be intended to include different orientations of a device in use or operation, in addition to the orientations depicted in the drawings. For example, when the device in the figure is flipped over, an element described as "below" another element or feature is directed "above" the other element or feature. Therefore, the term "below" can include both above and below. The device may be oriented in the other direction (rotated 90 degrees or in any other direction) and the spatially relative terms used herein are interpreted accordingly. Additionally, the term "treatment" may also be referred to as a term "process".

An example in which the first member 11 and the second member 12 are joined at the normal temperature in the atmosphere. However, the present disclosure is not limited to this example. The first member 11 and the second member 12 may also be joined at the normal temperature under the vacuum or reduced pressure. In the joining under the vacuum, it is possible to provide both of the metal films 14a, 14b, or it is possible to provide only one of the metal films 14a, 14b. For example, the metal film 14a may not be provided at the first surface 11a, the metal film 14b may be provided at the second surface 12a, and the first member 11 and the second member 12 may be joined at the normal temperature under the vacuum. In this situation, the metal joint layer 13 includes the first joint layer 13b as the gold joint layer. In other words, the metal joint layer 13 may have only one of the first joint layers 13a, 13b (gold joint layer).

The first embodiment describes an example in which the second metal film 14c is provided between the first member 11 and the first metal film 14a, and the second metal film 14d is provided between the second member 12 and the first metal film 14b. However, the present disclosure is not limited to this example. It is possible to provide only one of the second metal films 14c, 14d. For example, in a structure where only the first metal film 14b is formed, the second metal film 14d may be provided between the second surface 12a of the second member 12 and the first metal film 14b, and the second metal film 14c may not be provided above the first surface 11a without the first metal film 14a.

What is claimed is:

1. A joint structure comprising:
a first member including a first surface, the first member made of material having at least one of copper, copper alloy, aluminum or aluminum alloy;
a second member including a second surface that faces the first surface of the first member; and
a metal joint layer including at least a gold joint layer made of material having at least one of gold or gold alloy, the metal joint layer disposed between the first surface of the first member and the second surface of the second member, and configured to join the first member and the second member,
wherein a joint region where the metal joint layer joins the first surface is defined as a first joint region, and another joint region where the metal joint layer joins the second surface is defined as a second joint region,
wherein a thickness of the metal joint layer is smaller than flatness of the first surface at the first joint region and flatness of the second surface at the second joint region, and
wherein fluorine is dispersed inside at least the gold joint layer included in the metal joint layer.

2. The joint structure according to claim 1,
wherein the gold joint layer is a first joint layer,
wherein the metal joint layer further includes a second joint layer that is disposed at least one of a location between the first member and the first joint layer or a location between the second member and the first joint layer,
wherein a thermal expansion coefficient of the second joint layer is smaller than a thermal expansion coefficient of the material of the first joint layer.

3. The joint structure according to claim 2,
wherein the second joint layer is made of material including at least one of tantalum, tungsten, titanium or chrome.

4. An electronic device comprising:
a heat radiation member; and
a joint structure including:
a board having a first surface and a second surface on which the heat radiation member is mounted, the board made of material having at least one of copper, copper alloy, aluminum or aluminum alloy, the first surface opposed to the second surface;
a heat conductor configured to be joined to the board and conduct heat generated by the heat radiation member through the board, the heat conductor having a surface facing the first surface of the board; and
a metal joint layer configured to join the board and the heat conductor, the metal joint layer having at least a gold joint layer made of material having at least one of gold or gold alloy, the metal joint layer disposed between the first surface of the board and the surface of the heat conductor,
wherein a joint region where the metal joint layer joins the first surface of the board is defined as a first joint region, and another joint region where the metal joint layer joins the surface of the heat conductor is defined as a second joint region,
wherein a thickness of the metal joint layer is smaller than flatness of the first surface of the board at the first joint region and flatness of the surface of the heat conductor at the second joint region, and
wherein fluorine is dispersed inside at least the gold joint layer included in the metal joint layer.

5. An electronic device comprising:
a joint structure including:
- an electronic component including a lead made of material having at least one of copper, copper alloy, aluminum or aluminum alloy, the lead having a first surface; and
- a wiring member that is configured to be joined to the lead, the wiring member including a second surface facing the first surface of the lead; and
- a metal joint layer including at least a gold joint layer made of material having at least one of gold or gold alloy, the metal joint layer disposed between the first surface of the lead and the second surface of the wiring member, and configured to join the lead and the wiring member, wherein a joint region where the metal joint layer joins the first surface of the lead is defined as a first joint region, and another joint region where the metal joint layer joins the second surface of the wiring member is defined as a second joint region, wherein a thickness of the metal joint layer is smaller than flatness of the first surface of the lead at the first joint region and flatness of the second surface of the wiring member at the second joint region, and wherein fluorine is dispersed inside at least the gold joint layer included in the metal joint layer.

* * * * *